(12) United States Patent
Tanaka et al.

(10) Patent No.: US 10,622,191 B2
(45) Date of Patent: Apr. 14, 2020

(54) SUBSTRATE PROCESSING METHOD

(71) Applicant: ASM IP Holding B.V., Almere (NL)

(72) Inventors: Koji Tanaka, Hino (JP); Tomohiro Arakawa, Sagamihara (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/892,773

(22) Filed: Feb. 9, 2018

(65) Prior Publication Data
US 2019/0252155 A1   Aug. 15, 2019

(51) Int. Cl.
*H01L 21/02* (2006.01)
*H01J 37/32* (2006.01)
*C23C 16/455* (2006.01)

(52) U.S. Cl.
CPC .. *H01J 37/32183* (2013.01); *C23C 16/45536* (2013.01); *H01J 37/32568* (2013.01); *H01L 21/0228* (2013.01); *H01L 21/02274* (2013.01); *H01J 2237/332* (2013.01); *H01J 2237/334* (2013.01); *H01J 2237/3321* (2013.01)

(58) Field of Classification Search
CPC ........... H01J 37/32183; H01J 37/32568; H01J 2237/332; H01J 2237/3321; H01J 2237/334; H01L 21/0228; H01L 21/02274; C23C 16/45536
See application file for complete search history.

(56) References Cited

U.S. PATENT DOCUMENTS

2016/0079037 A1 * 3/2016 Hirano ............. H01J 37/32146
156/345.28

FOREIGN PATENT DOCUMENTS

WO   2013/190987 A1   12/2013

* cited by examiner

*Primary Examiner* — Thanh T Nguyen
(74) *Attorney, Agent, or Firm* — Studebaker & Brackett PC

(57) ABSTRACT

A substrate processing method includes supplying RF power from an RF power supply provided with a linear amplifier to a plasma generation apparatus via an electronic matcher, thereby generating plasma and starting a process on a substrate, and stopping the supply of the RF power from the RF power supply when a prescribed time elapses after the generation of plasma starts.

12 Claims, 6 Drawing Sheets

SUBSTRATE PROCESSING METHOD

BACKGROUND

Field

Examples are described which relate to a substrate processing method.

Background Art

Impedance matching is desired when high frequency power (hereinafter, may also be referred to as "RF power") is supplied from a high frequency power supply apparatus to a load. Unless impedance matching is achieved, part of the high frequency power may be reflected and loss may be generated.

A plasma generation apparatus is an apparatus that generates plasma with high frequency power. The plasma generation apparatus applies a plasma process to a substrate. Performing, for example, film formation, reforming or etching using plasma is called "plasma processing."

During plasma generation or the like, an impedance of a load fluctuates. Quick impedance matching against the impedance fluctuation of the load is therefore desired. For example, an output impedance of a matcher is desired to be quickly made equal to the input impedance of the load. Therefore, techniques have been developed for quickly achieving impedance matching against a fluctuation of load impedance. Not only quick achievement of impedance matching but also high response and stability of RF power may be important to perform an intended plasma process.

SUMMARY

Some examples described herein may address the above-described problems. Some examples described herein may provide a substrate processing method capable of quickly generating plasma with high stability against a fluctuation of load impedance.

In some examples, a substrate processing method includes supplying RF power from an RF power supply provided with a linear amplifier to a plasma generation apparatus via an electronic matcher, thereby generating plasma and starting a process on a substrate, and stopping the supply of the RF power from the RF power supply when a prescribed time elapses after the generation of plasma starts.

DETAILED DESCRIPTION

Figure 1:
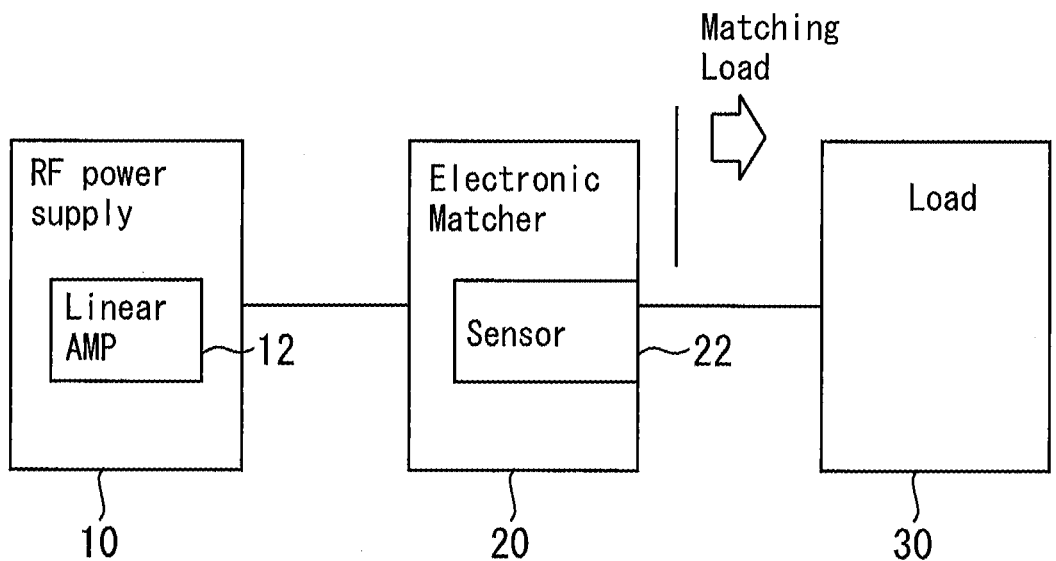
FIG. 1 is a block diagram of a plasma processing system.

A substrate processing method according to some examples will be described with reference to the accompanying drawings. Identical or corresponding components may be assigned identical reference numerals and duplicate description may be omitted.

FIG. 1 is a block diagram of a plasma processing system. FIG. 1 illustrates an RF power supply 10, an electronic matcher 20 and a load 30. The RF power supply 10 includes a linear amplifier 12. Efficiency of the linear amplifier 12 is, for example, 50% or less. The RF power supply 10 amplifies a signal using the linear amplifier 12 and outputs RF power. Any publicly known linear amplifiers can be used as the linear amplifier 12. A linear amplifier of class A, class B, class AB or class C can be used as the linear amplifier 12. Class C is the class of the linear amplifier with highest efficiency.

The electronic matcher 20 is a matching circuit that controls an inductance (L) or a capacitance (C) for impedance matching. A sensor 22 is provided on an output side of the electronic matcher 20. The sensor 22 detects power input to the load 30, reflected power and a power factor. When an impedance of the load 30 fluctuates, an impedance of the electronic matcher 20 is corrected based on the detection result of the sensor 22, thus achieving impedance matching. Since there is no mechanical drive part in the electronic matcher 20, it is possible to change the impedance of the electronic matcher 20 at a high speed on the order of msec or μsec.

Figure 2:
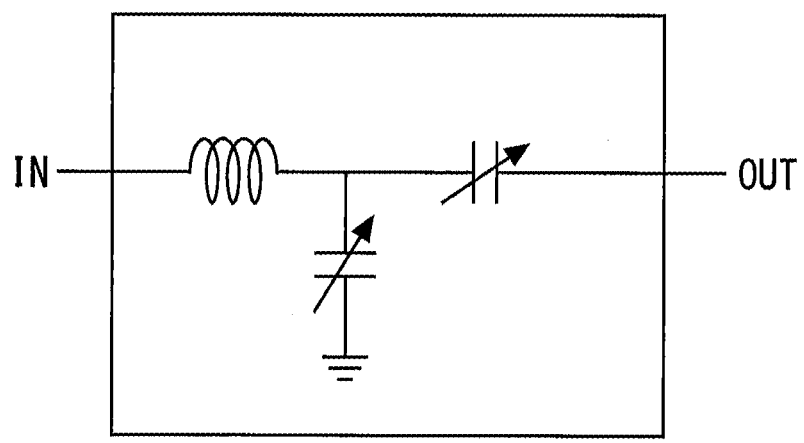
FIG. 2 illustrates an electronic matcher.
Figure 3:
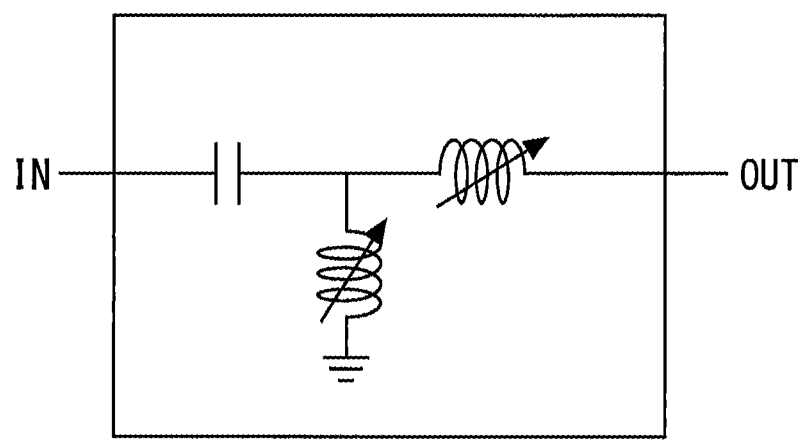
FIG. 3 illustrates an another electronic matcher.
Figure 4:
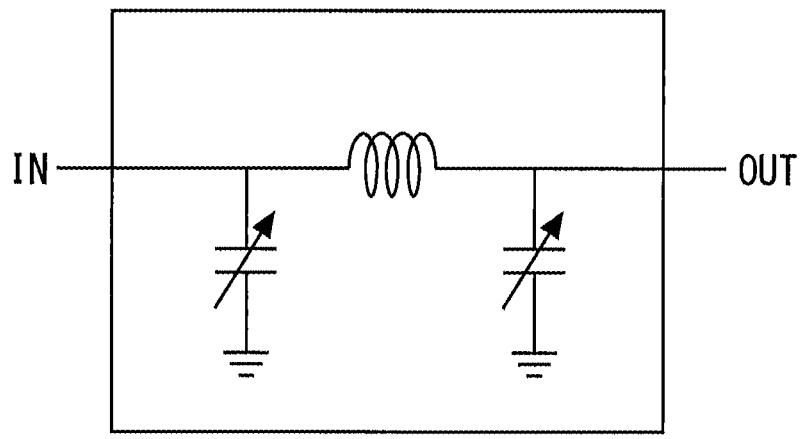
FIG. 4 illustrates a still another electronic matcher.

FIGS. 2 to 4 illustrate examples of the electronic matcher. FIG. 2 illustrates an electronic matcher having an L-type variable capacitance. FIG. 3 illustrates an electronic matcher having an L-type variable inductance. FIG. 4 illustrates an electronic matcher having Π-type variable capacitance.

Figure 5:
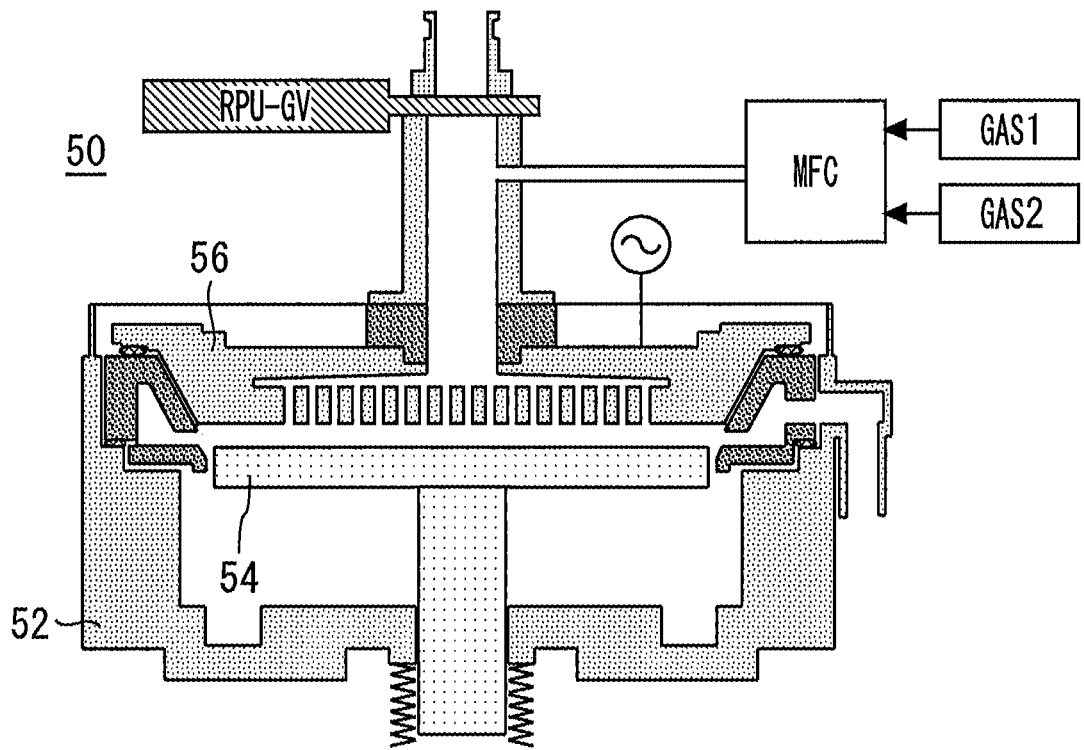
FIG. 5 is a cross-sectional view of a plasma generation apparatus.

The load 30 can be a plasma generation apparatus. FIG. 5 is a cross-sectional view of a plasma generation apparatus 50. The plasma generation apparatus 50 is provided with a chamber 52, an RF plate 56 and a grounding plate 54. The RF plate 56 and the grounding plate 54 are placed facing each other. RF power is applied to the RF plate 56. The grounding plate 54 is a metal plate that supports a substrate. Plasma is generated by applying RF power to the RF plate 56 while supplying a gas into a space between the RF plate 56 and the grounding plate 54. An intended process is applied to the substrate using the plasma.

A switching amplifier may be used as an RF power supply amplifier. The switching amplifier is an amplifier which is more efficient than a linear amplifier. The switching amplifier is a class D or class E amplifier. Use of an RF power supply provided with a switching amplifier as the RF power supply used for plasma excitation such as plasma CVD, ALD, etching or ALE is a latest technological trend. CVD stands for Chemical Vapor Deposition, ALD stands for Atomic Layer Deposition, and ALE stands for Atomic Layer Etching.

Figure 6:
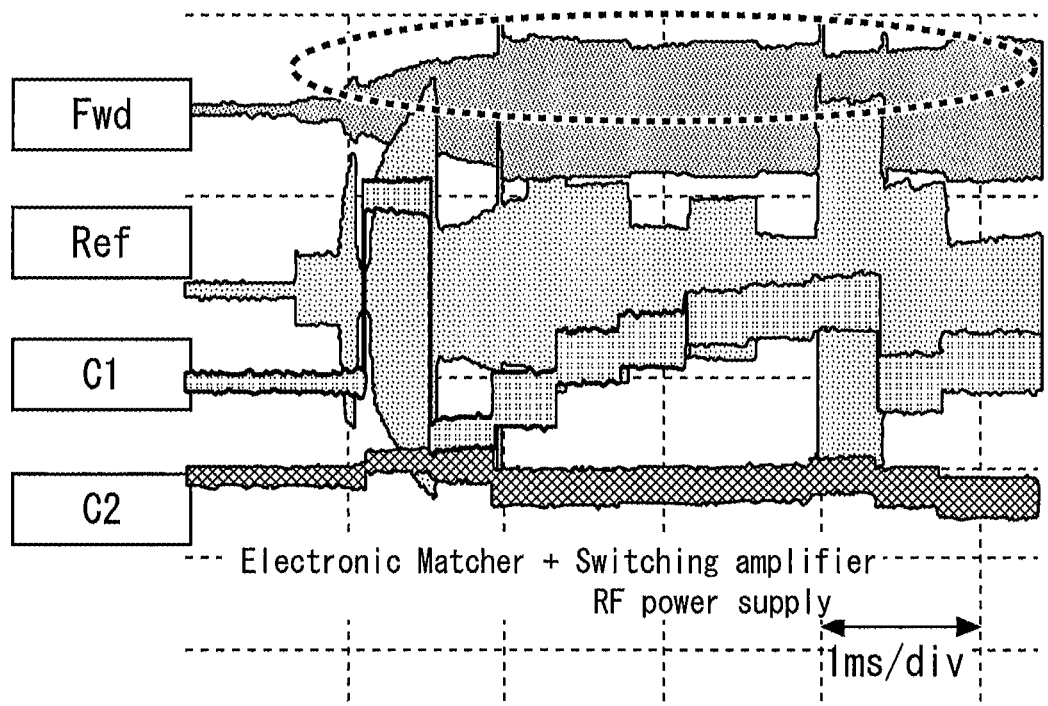
FIG. 6 is a diagram illustrating a signal waveform.

However, when the RF power amplified by the switching amplifier is supplied to the load via the electronic matcher, RF output is not stable. FIG. 6 is a diagram illustrating a signal waveform when the RF power amplified by the switching amplifier is outputted to the load via the electronic matcher. A class E switching amplifier is used as the switching amplifier. "Fwd" represents traveling wave power, "Ref" represents reflected power and "C1" and "C2" represent capacitances of capacitors making up the electronic matcher. C1 and C2 are switched every approximately 200 to 400 μsec.

The electronic matcher can cause an impedance to discretely fluctuate by switching. This causes a load impedance to drastically change and the traveling wave power is thereby affected. An area enclosed by a broken line in FIG.

6 indicates that the RF output does not rise fast and the traveling wave power does not become stable with a lapse of time. The switching amplifier used as the RF power supply amplifier is susceptible to fluctuations in the load impedance. This makes the RF output unstable and makes impedance matching more difficult. In this way, even if an attempt is made to achieve quick impedance matching using the electronic matcher, if a switching amplifier is used for the RF power supply, highly stable plasma cannot be generated.

Figure 7:
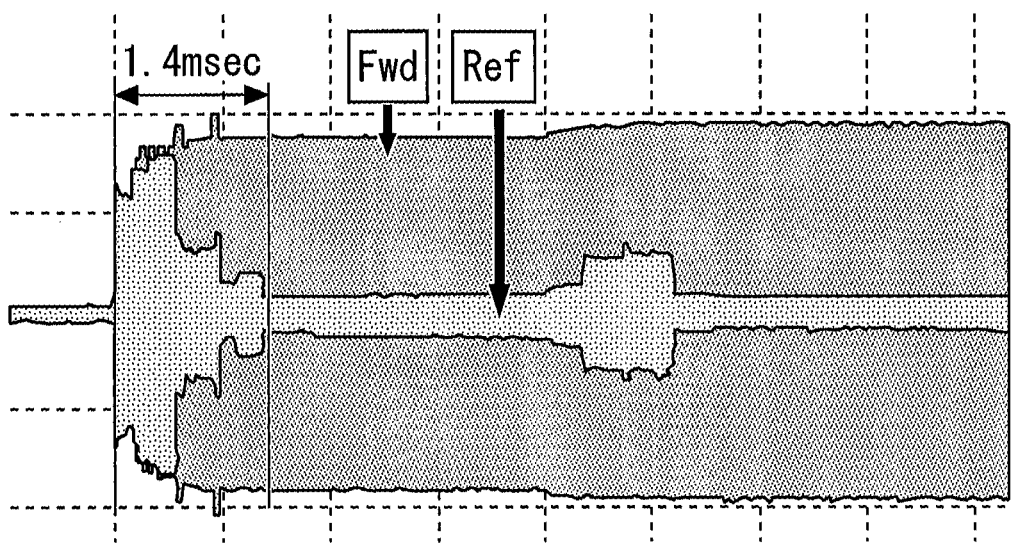
FIG. 7 is a diagram illustrating a signal waveform.

FIG. 7 is a diagram illustrating a signal waveform when the RF power amplified by a linear amplifier is outputted to the load via the electronic matcher. A class C linear amplifier is used as the linear amplifier. FIG. 7 shows that the traveling wave power becomes stable in approximately 1.4 msec after a fluctuation of load impedance. Therefore, according to the configuration in FIG. 1, it may possible to quickly follow a fluctuation of load impedance by adjusting the impedance using the electronic matcher 20, and generate highly stable plasma using the linear amplifier 12 for the RF power supply 10.

It is possible to perform a substrate process including supplying RF power from the RF power supply 10 to the plasma generation apparatus which is the load 30 via the electronic matcher 20 using the apparatus in FIG. 1, thereby generating plasma and starting a process on the substrate and stopping the supply of the RF power from the RF power supply 10 when a prescribed time elapses after the generation of plasma is started. It may possible to generate highly stable plasma by amplifying a signal through the linear amplifier 12 in the RF power supply 10.

Thus, according to the plasma processing system in FIG. 1, it may possible to quickly generate highly stable plasma. Quickly achieving impedance matching against a fluctuation of load impedance means improving controllability on an interface in film formation. If impedance matching takes much time in a substrate process with a short plasma processing time (RF-on time), an intended plasma process cannot be implemented for most part of the processing time. However, if the substrate process is performed using the plasma processing system in FIG. 1, it may possible to quickly generate highly stable plasma and thereby implement the intended plasma process in most part of the processing time. For example, the above-described substrate process using plasma makes it possible to perform an ALD process with an RF-on time per cycle of 50 msec or less, CVD, reforming process or ALE with an RF-on time of 3 sec or less. For example, it is possible to form an insulating film having a film thickness of several nm or control an interface state.

The load impedance considerably fluctuates at timing at which plasma is generated from the state in which no plasma exists. Changing a gas composition in the plasma generation apparatus while plasma is being generated, changing a gas pressure in the plasma generation apparatus, or changing the gap between the RF plate and the grounding plate can also cause the load impedance to change. Even when the load impedance changes in this way, the above-described method may makes it possible to quickly generate highly stable plasma and thereby perform the intended process.

Figure 8:
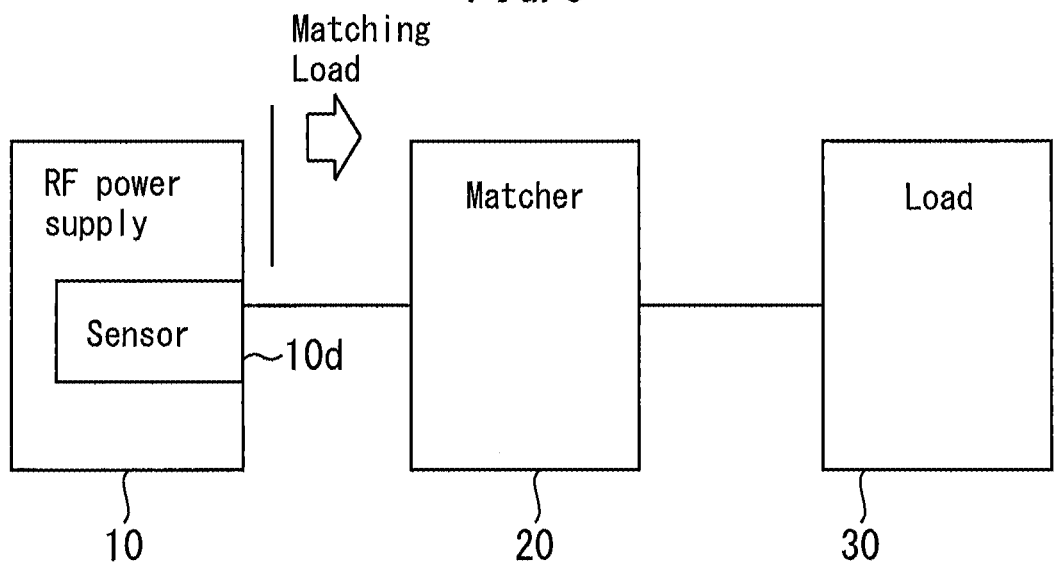
FIG. 8 is a block diagram of the plasma processing system according to another example.
Figure 9:
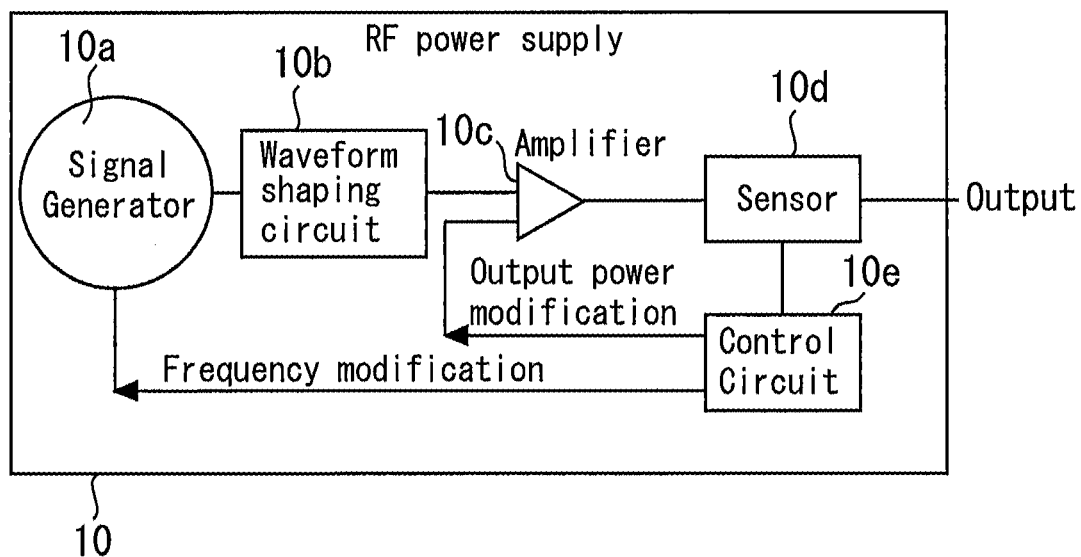
FIG. 9 is a block diagram illustrating the RF power supply.

FIG. 8 is a block diagram of the plasma processing system according to another example. The RF power supply 10 is provided with the linear amplifier and a sensor 10d. The same sensor 22 in FIG. 1 can be used as the sensor 10d. FIG. 9 is a block diagram illustrating the RF power supply 10 in FIG. 8. A signal generator 10a generates an RF signal. The RF signal is shaped by a waveform shaping circuit 10b, amplified by the linear amplifier 10c and outputted as RF power. The sensor 10d is provided on the output side of the RF power supply 10. The RF power is monitored by the sensor 10d.

A control circuit 10e changes the frequency of the RF signal generated by the signal generator 10a so as to achieve impedance matching from information on the reflected power obtained from the sensor 10d. The control circuit 10e determines whether or not the value of traveling wave power obtained from the sensor 10d is a set value, and changes, if it is not a set value, a signal amplification factor at the linear amplifier 10c such that the set value is obtained. A scheme in which the frequency of the RF signal is changed to achieve impedance matching is called "f-tune." Under this scheme, the load impedance seen from the RF power supply 10 is set to, for example, 50Ω.

Returning to the description in FIG. 8, in the plasma processing system in FIG. 8, the RF power from the RF power supply 10 is supplied to the load 30 via the electronic matcher 20. Since impedance matching is achieved using the RF power supply in FIG. 9 as described above, the electronic matcher 20 may be omitted. Instead of the electronic matcher 20, an impedance fixed type matcher may also be used.

Figure 10:
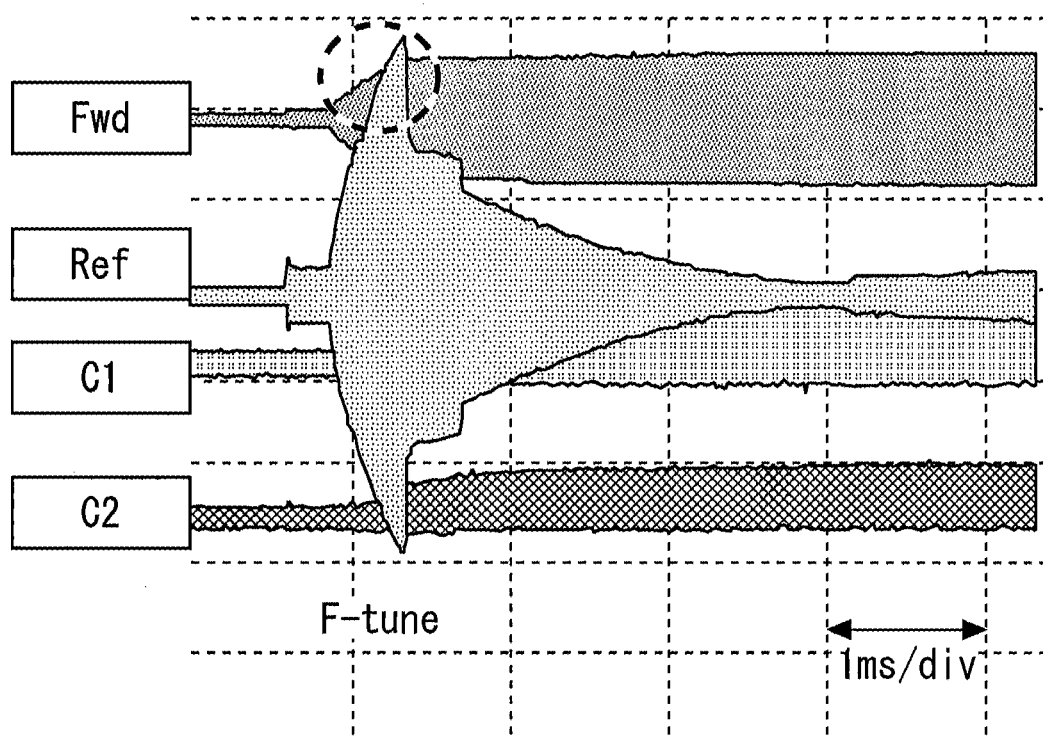
FIG. 10 is a waveform diagram.

FIG. 10 is a waveform diagram when impedance matching is achieved against a fluctuation of load impedance according to an f-tune scheme. The waveform in FIG. 10 is acquired using a switching amplifier as the amplifier of the RF power supply. According to f-tune, the frequency is gradually made to fluctuate to cause the impedance to fluctuate consecutively and little by little, and so it is seen that the traveling wave power is stable. When attention is focused on an area enclosed by a broken line, it is seen that the traveling wave power rises up to output power within 1 ms. Therefore, stability of the traveling wave power is excellent. Note that C1 and C2 are also shown in FIG. 10, and if the f-tune scheme is adopted, C1 and C2 are assumed to be fixed.

Figure 11:
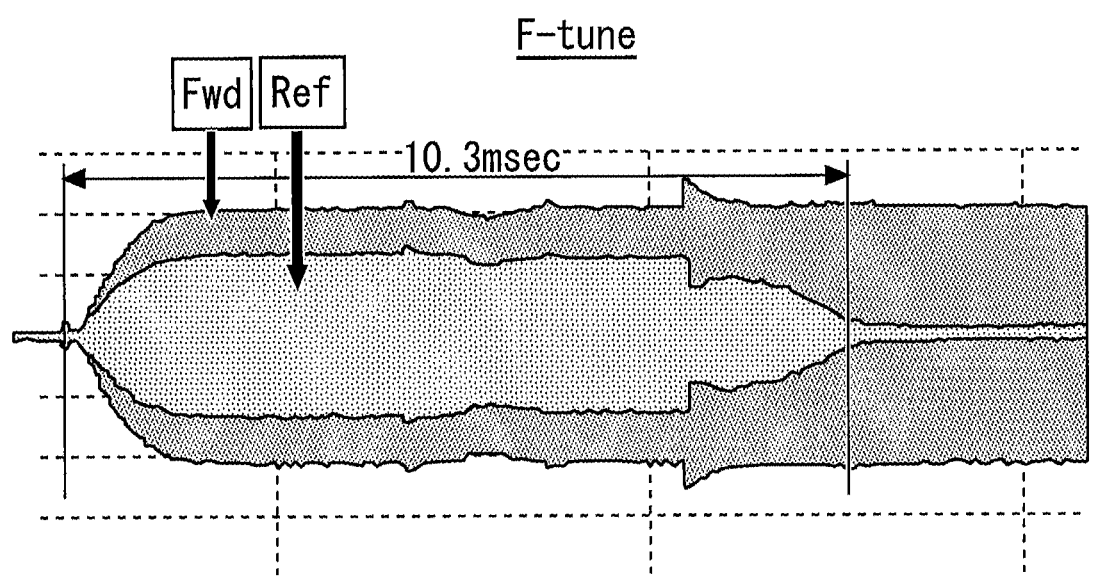
FIG. 11 is a waveform diagram.

However, even when an attempt is made to achieve impedance matching by f-tune, if the switching amplifier is used, operation becomes unstable if the load impedance change significantly. FIG. 11 is a waveform diagram of impedance matching by f-tune when the switching amplifier is used. The RF output is slightly unstable. Under the control by f-tune, the frequency of the RF signal can be adjusted within a range of, for example, 12.0 MHz to 15.0 MHz to achieve impedance matching.

The inventor has discovered that the linear amplifier 12 used for the RF power supply 10 plays role to achieve impedance matching when f-tune scheme is employed, and it is thereby possible to quickly generate highly stable plasma against a fluctuation of load impedance. For example, it is possible to generate plasma and start a process on the substrate by amplifying RF power with a frequency adjusted by the RF power supply 10 so as to achieve impedance matching by the linear amplifier 12 and supplying the RF power to the plasma generation apparatus. When a prescribed time elapses after generation of plasma is started, it is possible to stop the supply of the RF power from the RF power supply 10. Even when the load impedance change significantly, it is possible to stabilize traveling wave power using the linear amplifier 12 as the amplifier of the RF power supply 10.

Plasma processing using the electronic matcher 20 shown in FIG. 1 above can be implemented even under the scheme using f-tune shown in FIG. 8. It may possible to quickly generate highly stable plasma when a load impedance fluctuates even in the case of impedance matching by the linear amplifier 12 and the electronic matcher 20 described with reference to FIG. 1 and in the case of impedance matching by f-tune described with reference to FIG. 8. Quickly generating highly stable plasma may makes it possible to control influences on a base layer of the substrate or the state of the interface. When the plasma process is performed for a short period of time, for example, 50 msec or less, control on the base layer or the state of the interface is particularly considered important.

An effect of combining the high speed impedance matcher represented by the electronic matcher and f-tune with the RF power supply 10 provided with the linear amplifier 12 has been described in each example above. Such a configuration is particularly useful in that when traveling wave power or reflected power fluctuates on the order of, for example, msec it is possible to quickly follow the fluctuation. According to the aforementioned substrate processing method, it is possible to achieve high speed plasma process control. For example, it is possible to shorten a discharge start time for interface control or improve throughput by switching gas at high speed.

According to the examples described, it may possible to quickly generate highly stable plasma against a fluctuation of load impedance by combining high speed impedance matching represented by an electronic matcher with an RF power supply having a linear amplifier.

What is claimed is:

1. A substrate processing method comprising:
   supplying RF power from an RF power supply provided with a linear amplifier to a plasma generation apparatus via an electronic matcher, the electronic matcher not including a mechanical drive part, thereby generating plasma and starting a process on a substrate; and
   stopping the supply of the RF power from the RF power supply when a prescribed time elapses after the generation of plasma starts, such that
   a stable plasma is achieved in approximately 1.4 msec after a fluctuation of a load impedance.

2. The substrate processing method according to claim 1, wherein the process on the substrate using plasma includes an ALD process with an RF-on time per cycle of 50 msec or less.

3. The substrate processing method according to claim 1, wherein the process on the substrate using plasma includes CVD, a reforming process or ALE with an RF-on time of 3 seconds or less.

4. The substrate processing method according to claim 1, wherein a gas composition in the plasma generation apparatus is changed during the generation of plasma.

5. The substrate processing method according to claim 1, wherein a gas pressure in the plasma generation apparatus is changed during the generation of plasma.

6. The substrate processing method according to claim 1, wherein the plasma generation apparatus comprises an RF plate to which the RF power is applied and a grounding plate that is placed so as to face the RF plate and supports the substrate, and
   a gap between the RF plate and the grounding plate is changed during the generation of plasma.

7. A substrate processing method comprising:
   amplifying with a linear amplifier, RF power with a frequency adjusted so as to achieve impedance matching, supplying the RF power to a plasma generation apparatus, thereby generating plasma and starting a process on the substrate; and
   stopping the supply of the RF power when a prescribed time elapses after the generation of plasma starts, wherein
   the frequency of the RF power is 13.56 MHz or higher.

8. The substrate processing method according to claim 7, wherein the process on the substrate using plasma includes an ALD process with an RF-on time per cycle of 50 msec or less.

9. The substrate processing method according to claim 7, wherein the process on the substrate using plasma includes CVD, a reforming process or ALE with an RF-on time of 3 seconds or less.

10. The substrate processing method according to claim 7, wherein a gas composition in the plasma generation apparatus is changed during the generation of plasma.

11. The substrate processing method according to claim 7, wherein a gas pressure in the plasma generation apparatus is changed during the generation of plasma.

12. The substrate processing method according to claim 7, wherein the plasma generation apparatus comprises an RF plate to which the RF power is applied and a grounding plate that is placed so as to face the RF plate and supports the substrate, and
    a gap between the RF plate and the grounding plate is changed during the generation of plasma.

* * * * *